United States Patent
Park et al.

(10) Patent No.: US 9,698,163 B2
(45) Date of Patent: Jul. 4, 2017

(54) FREE-FORM DISPLAY

(71) Applicant: LG DISPLAY CO., LTD., Seoul (KR)

(72) Inventors: Chansoo Park, Goyang-si (KR); Seeung Lee, Bucheon-si (KR); Seungseok Ryoo, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/336,324

(22) Filed: Oct. 27, 2016

(65) Prior Publication Data

US 2017/0125448 A1 May 4, 2017

(30) Foreign Application Priority Data

Oct. 30, 2015 (KR) .................. 10-2015-0151794

(51) Int. Cl.
*H01L 29/04* (2006.01)
*H01L 27/12* (2006.01)
*H01L 29/786* (2006.01)

(52) U.S. Cl.
CPC ........ *H01L 27/1218* (2013.01); *H01L 27/124* (2013.01); *H01L 29/78633* (2013.01)

(58) Field of Classification Search
CPC ............. H01L 27/0688; H01L 27/1052; H01L 27/1464; H01L 29/78696; H01L 27/1214; H01L 27/127; H01L 27/1218; H01L 29/78633

USPC ................................................... 257/776, 59
See application file for complete search history.

(56) References Cited

U.S. PATENT DOCUMENTS

2012/0188493 A1* 7/2012 Sato .................. G02F 1/133351
349/104

* cited by examiner

*Primary Examiner* — Theresa T Doan
(74) *Attorney, Agent, or Firm* — Dentons US LLP (57) ABSTRACT

A free-form display is disclosed which makes a step-like pattern adjacent to a free-form portion less visible. The free-form display has an active area and a bezel area, and at least part of a boundary between the active area and the bezel area has a free-form portion. The free-form portion comprises subpixel electrodes and a light blocking portion. A plurality of subpixel electrodes are placed in areas defined by a plurality of gate lines and a plurality of data lines that intersect each other. A light blocking portion has openings exposing the subpixel electrodes, respectively, and is arranged to overlap the gate lines and the data lines. The active area comprises subpixel areas where the subpixel electrodes are placed, and a non-pixel area where no subpixel electrodes are placed. The openings of the light blocking portion adjacent to the non-pixel area, are made in different sizes.

6 Claims, 10 Drawing Sheets

FREE-FORM DISPLAY

This application claims the benefit of priority under 35 U.S.C. §119(a) to Republic of Korea Patent Application No. 10-2015-0151794 filed on Oct. 30, 2015, the entire contents of which are incorporated herein by reference for all purposes as if fully set forth herein.

BACKGROUND OF THE INVENTION

Field of the Invention

The present invention relates to a display and a method of manufacturing the same, and more particularly, to a free-form display.

Discussion of the Related Art

With the development of the information society, various demands for display devices for displaying images are on the rise. In the field of display devices, flat panel displays (FPDs), which are thin and light and can cover a large area, have been rapidly replacing cathode ray tubes (CRTs), which are bulky. For example, a variety of flat panel displays have been developed and used, including liquid crystal displays (LCDs), plasma display panels (PDPs), organic light-emitting displays (OLEDs), field-emission display devices (FEDs), electrophoretic displays (EDs), etc.

However, these flat panel display have been developed for large screens with a rectangular display panel for displaying images, and thus, are typically not suitable for displays having specific or free-form shapes. For example, rectangular displays are typically not suitable for displays for wall clocks, wristwatches, and dashboards, for example, which have a variety of shapes like circles, ellipses, or diagonals. To keep up with this consumer demand, free-form displays such as circular, elliptical, or diagonal displays have been under development in recent years.

Figure 1:
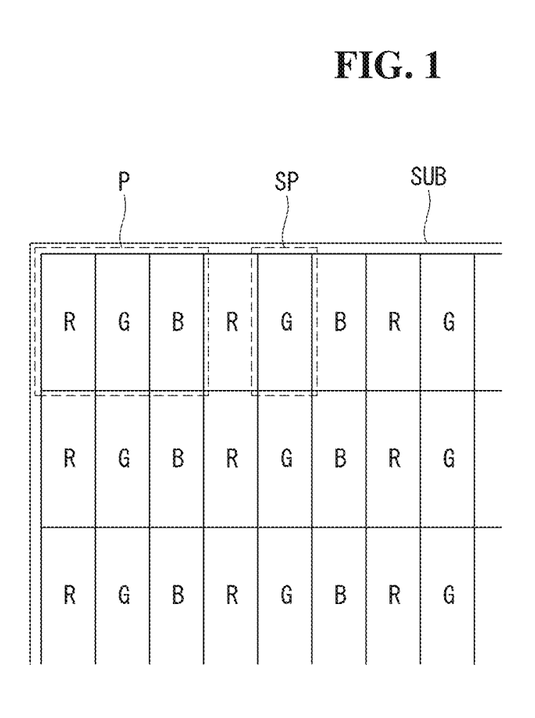
FIG. 1 is a top plan view schematically showing a structure of some area of a related art rectangular display.
Figure 2:
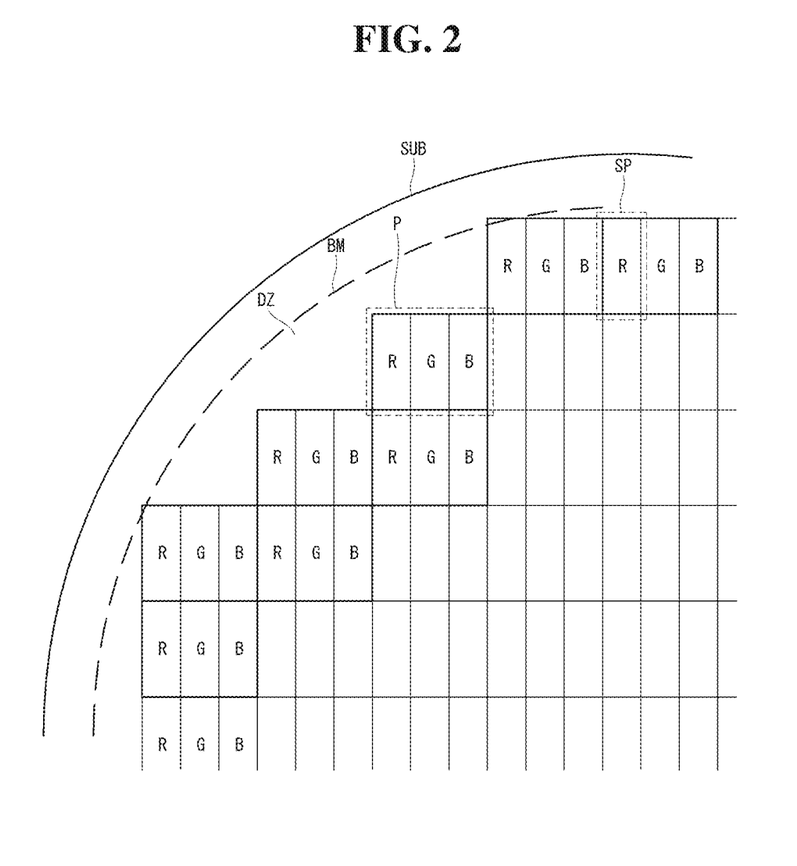
FIG. 2 is a top plan view showing an edge structure of a circular display with a related art pixel arrangement.

Referring to FIGS. 1 and 2, a rectangular display and a circular display with the same pixel arrangement as the rectangular display according to the related art will be described.

FIG. 1 is a top plan view schematically showing a structure of some area of a related art rectangular display. FIG. 2 is a top plan view showing an edge structure of a circular display with a related art pixel arrangement.

Referring to FIG. 1, a related art display device comprises rectangular unit pixels P arranged in a matrix on a rectangular substrate SUB, with each unit pixel P comprising a plurality of subpixels SP. To generate the primary colors of red, green, and blue to achieve full color, a unit pixel P may include a red subpixel (R), a green subpixel (G), and a blue subpixel (B).

For circular, elliptical or diagonal displays, their outlines are circular, elliptical, or diagonal. A free-form display with a circular, elliptical, or diagonal outline uses the same pixel structure as the related art rectangular display, as illustrated in FIG. 2.

Referring to FIG. 2, the circular display has a round, disc-shaped substrate SUB. Rectangular unit pixels P are arranged in a matrix on the disc-shaped substrate SUB. However, the rectangular unit pixels P are arranged in a step shape alone the circular edge of the substrate. That is, no pixels are placed in between the outermost pixels P of a data display area and the outline of the substrate SUB, which results in a dead zone where no image is displayed. Due to such a dead zone, the stepped outline of a black matrix BM may be visible to the user.

Accordingly, there is a need for development of a free-form display with high picture quality where a step-like pattern caused by such a dead zone is less visible to the user.

SUMMARY

Accordingly, the present invention is directed to a free-form display and a driving method thereof that substantially obviate one or more problems due to limitations and disadvantages of the related art.

An advantage of the present invention is to provide a free-form display with a less visible step-like pattern.

Additional features and advantages of the present invention will be set forth in the description which follows, and in part will be apparent from the description, or may be learned by practice of the invention. These and other advantages of the present invention will be realized and attained by the structure particularly pointed out in the written description and claims hereof as well as the appended drawings.

To achieve these and other advantages and in accordance with the purpose of the present invention, as embodied and broadly described, a free-form display having an active area and a bezel area, at least part of a boundary between the active area and the bezel area having a free-form portion, the free-form display including a plurality of subpixel electrodes in areas defined by a plurality of gate lines and a plurality of data lines that cross with each other; and a light blocking portion that has openings exposing the plurality of subpixel electrodes and that is arranged to overlap the plurality of gate lines and the plurality of data lines, wherein the active area comprises a subpixel area where the subpixel electrodes are disposed, and a non-pixel area where no subpixel electrodes is disposed, and wherein the openings of the light blocking portion adjacent to the non-pixel area are made in different sizes.

The openings of the black matrix adjacent to the non-pixel area, get smaller in size as the shortest distance between an outermost side of the non-pixel area and an outermost side of the pixel area decreases.

The openings in the light blocking portion adjacent to the non-pixel area, are changed in size proportionately.

The openings in the light blocking portion adjacent to the non-pixel area, are changed in size proportionately according to gamma characteristics.

The subpixel electrodes constitute a single unit pixel electrode consisting of a predetermined number of subpixel electrodes that produce full-color, and the openings are a same size for each unit pixel electrode.

The free-form portion includes at least one of circular, elliptical, curved, and diagonal shapes.

According to the free-form display according to an exemplary embodiment of the present invention, stepped lines on a light blocking portion can be made less visible since openings of a light blocking portion adjacent to a non-pixel area are made in different sizes and scaled in size proportionately.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Hereinafter, exemplary embodiments of the present invention will be described in detail with reference to the accompanying drawings. Throughout the specification, the same reference numerals indicate substantially the same components. In describing the present invention, when it is deemed that a detailed description of known functions or configurations may unnecessarily obscure the subject matter of the present invention, the detailed description will be omitted.

Hereinafter, a free-form display according to an exemplary embodiment of the present invention will be described with reference to FIGS. 3 to 5B.

Figure 3:
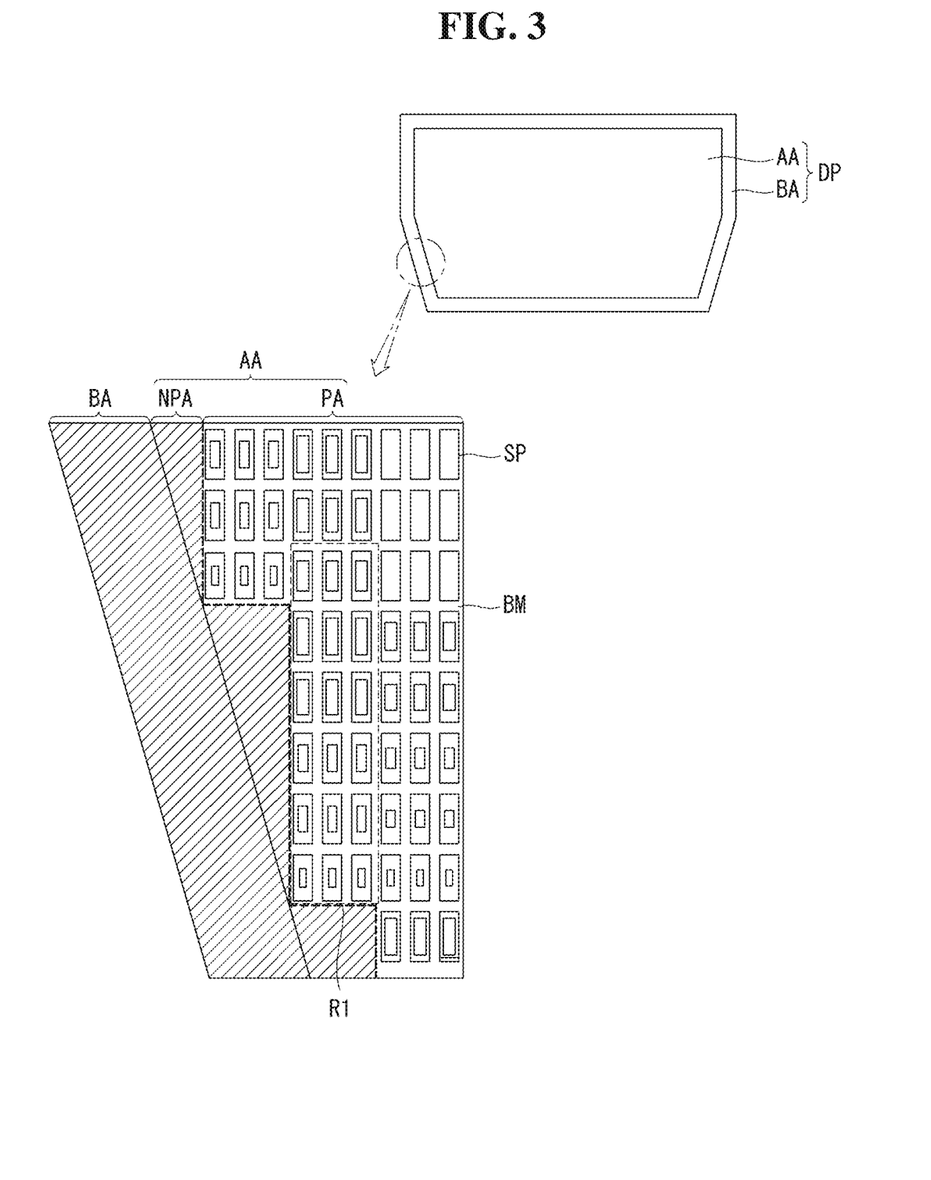
FIG. 3 is a top plan view schematically illustrating a free-form display according to an exemplary embodiment of the present invention.
Figure 4:
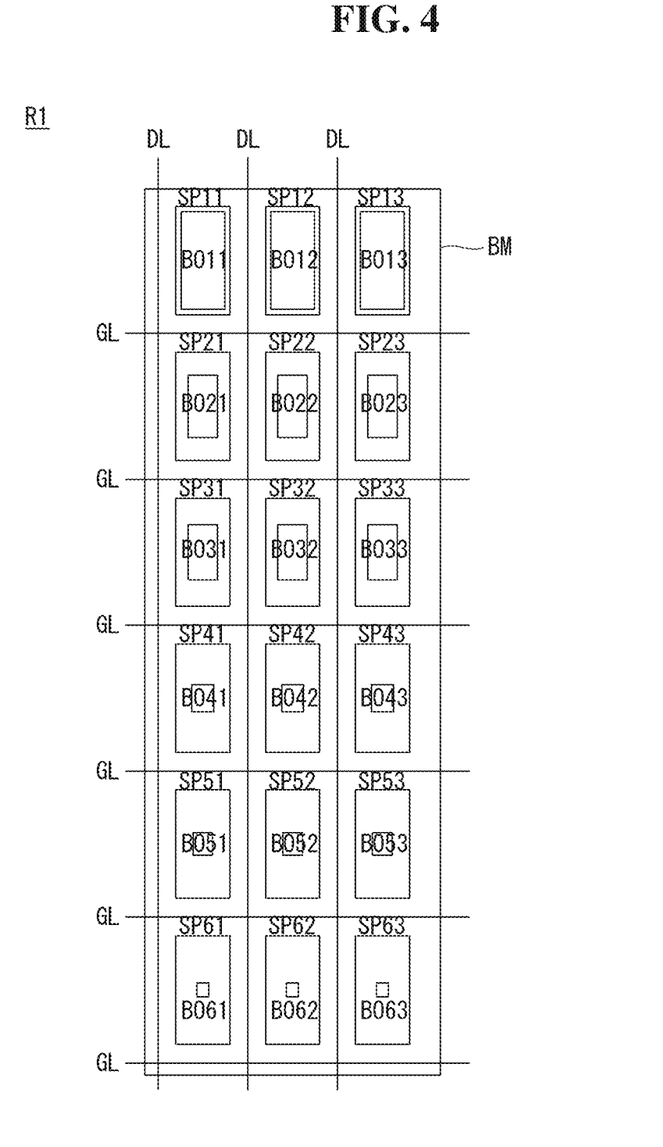
FIG. 4 is an enlarged top plan view showing the region R1 of FIG. 3.
Figure 5A:
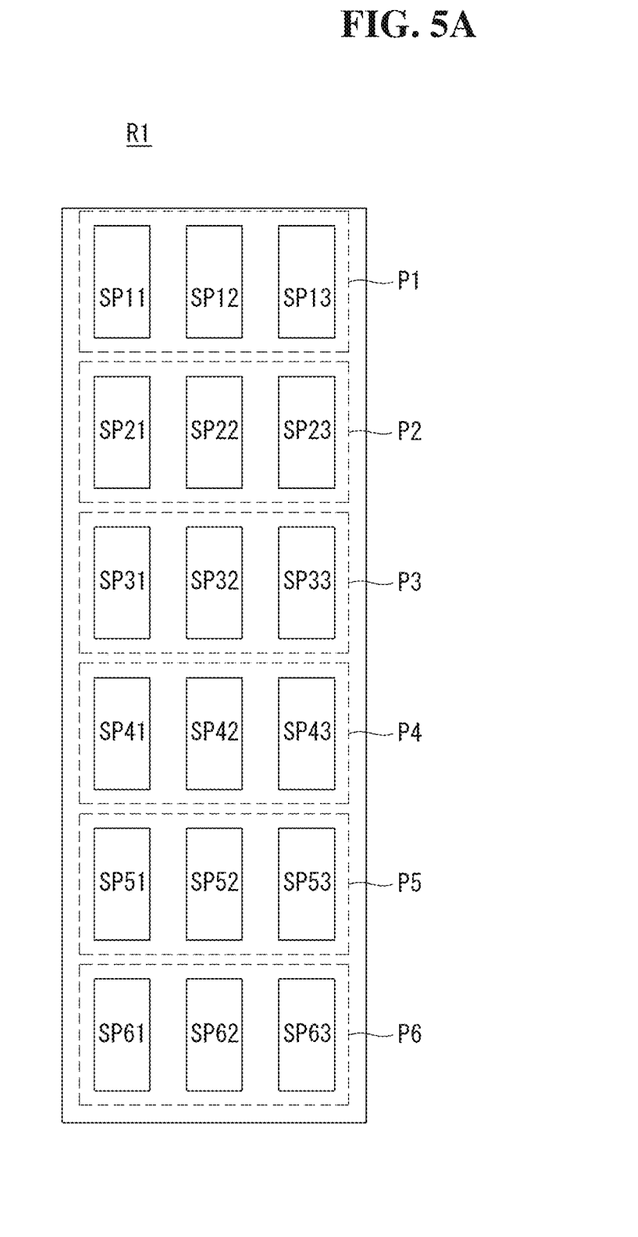
FIG. 5A is a top plan view showing the pixel electrodes of FIG. 4.
Figure 5B:
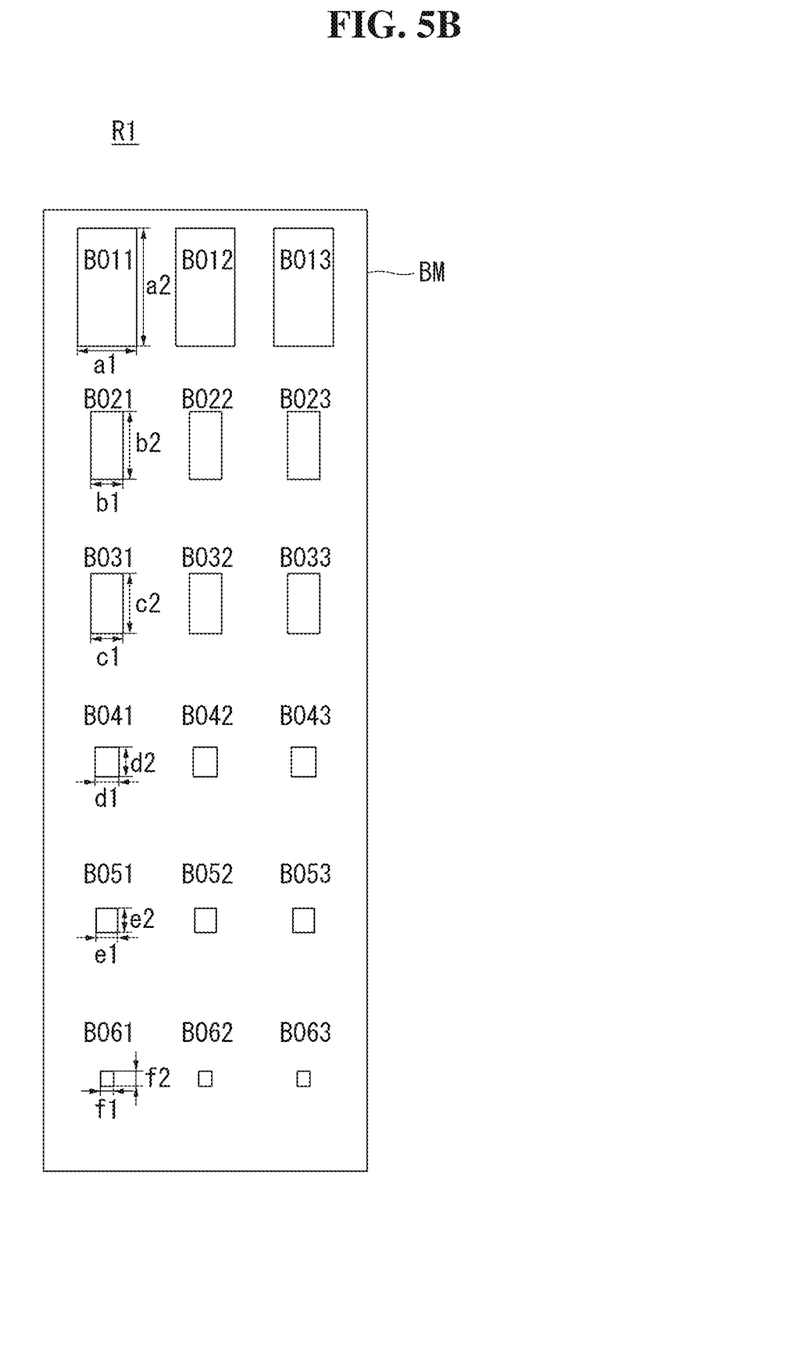
FIG. 5B is a top plan view showing the black matrix of FIG. 4.

FIG. 3 is a top plan view schematically showing a free-form display and a free-form portion according to an exemplary embodiment of the present invention. FIG. 4 is an enlarged top plan view showing the region R1 of FIG. 3. FIG. 5A is a top plan view showing the pixel electrodes of FIG. 4. FIG. 5B is a top plan view showing the black matrix of FIG. 4.

Referring to FIGS. 3 to 5B, a free-form display DP according to an exemplary embodiment of the present invention comprises an active area AA and a bezel area BA.

In the exemplary embodiment of the present invention, part of the boundary between the active area AA and the bezel area BA comprises a diagonal, free-form portion by way of an example, but the present invention is not limited to this. For example, the present invention is applicable to a free-form display comprising a free-form portion which is at least either circular, elliptical, curved, or diagonal.

The active area AA is a data display area, which comprises a pixel area PA where pixels are placed and a non-pixel area PA where no pixels are placed.

A light blocking portion may be placed in the bezel area BA, non-pixel area NPA, and pixel area PA. The light blocking portion has openings that expose the pixels placed in the pixel area. Although a black matrix will be described as an example of the light blocking portion, the light blocking portion of the present invention is not limited to this and may be anything as long as it has openings that expose the pixels of the display device.

The pixel area PA comprises subpixel areas exposed by the openings BO11 to BO63 of the black matrix BM. Subpixel electrodes P11 to P63 are placed in the subpixel areas. A predetermined number of subpixel electrodes constitute a single unit pixel electrode. For example, three subpixel electrodes of R (red), G (green), and B (blue) may form a single unit pixel electrode that can achieve full color. That is, the first subpixel electrodes P11 to P13 may constitute the first unit pixel electrode P1, the second subpixel electrodes P21 to P23 may constitute the second unit pixel electrode P2, the third subpixel electrodes P31 to P33 may constitute the third unit pixel electrode P3, the fourth subpixel electrodes P41 to P43 may constitute the fourth unit pixel electrode P4, the fifth subpixel electrodes P51 to P53 may constitute the fifth unit pixel electrode P5, and the sixth subpixel electrodes P61 to P63 may constitute the sixth unit pixel electrode P6.

The non-pixel area NPA is the area between the pixel area PA and the bezel area BA. The non-pixel area NPA is the area where no unit pixel electrodes can be placed in case that the display device has a circular, elliptical, curved, or diagonal portion.

The black matrix BM of this invention is placed in such a way as to enclose the subpixel electrodes P11 to P63 so that it covers the non-pixel area NPA and so that the subpixel electrodes P11 to P63 are separated from each other.

Referring to FIGS. 4 to 5B, the subpixel electrodes P11 to P63 are placed in areas defined by gate lines GL arranged in a first direction (e.g., horizontally as in the figures) and data lines DL arranged in a second direction (e.g., vertically as in the figures) perpendicular to the first direction. The subpixel electrodes P11 to P63 are the same size.

The black matrix BM comprises a plurality of openings BO11 to BO63 that expose at least part of each of the subpixel electrodes P11 to P63. Also, the black matrix BM is placed in such a way as to cover the gate lines GL and the data lines DL. Through the openings BO11 to BO63 of the black matrix BM, light is emitted to the portions corresponding to the subpixel electrodes P11 to P63 of the pixel area, whereby data is displayed.

The openings BO11 to BO63 of the black matrix BM are the same size in some areas and different sizes in other areas. For example, the openings BO11 to BO63 in the pixel area PA are configured to expose 100% of the subpixel electrodes (that is, to have an aperture ratio that exposes all of the subpixel electrodes) if they are placed further inside the pixel area PA, spaced a certain distance apart from the non-pixel area NPA, and the openings BO11 to BO63 in the pixel area PA may be configured to expose at least only part of the subpixel electrodes P11 to P63 if they are located adjacent to the non-pixel area NPA. The aperture ratio of the black matrix BM may be adjusted horizontally or vertically as in the figures by taking into account the positions of the openings of the black matrix BM and their distance to the non-pixel area.

FIG. 5B illustrates the openings BO11 to BO63 of the black matrix BM in the pixel area PA adjacent to the non-pixel area—that is, the openings BO11 to BO63 corresponding to the unit pixel electrodes.

As illustrated in FIG. 5B, the openings BO11 to BO63 of the black matrix BM adjacent to the non-pixel area NPA, get smaller in size as the shortest distance between the outermost side of the non-pixel area NPA and the outermost side of the pixel area PA decreases.

For example, the first width a1 and second width a2 of the openings BO11 to BO13 corresponding to the unit pixel electrode located at the top of the region R1 are different from the first width f1 and second width f2 of the openings BO61 to BO63 corresponding to the unit pixel electrodes located at the bottom of the region R1, respectively.

Specifically, if the openings BO11 to BO13 corresponding to the unit pixel electrodes placed in the top row (hereinafter, "first row") of the region R1 corresponding to the free-form portion are configured to have a (1-1)th width a1 and a (1-2)th width a2, the openings BO31 to BO33 corresponding to the unit pixel electrodes placed in the second row of the region R1 are configured to have a (2-1)th width b1 and a (2-2)th width b2, which are smaller than the (1-1)th width a1 and the (1-2)th width a2.

Also, if the openings BO31 to BO33 corresponding to the unit pixel electrodes placed in the third row of the region R1 are configured to have a (3-1)th width c1 and a (3-2)th width c2, the openings BO41 to BO43 corresponding to the unit pixel electrodes placed in the fourth row of the region R1 are configured to have a (4-1)th width d1 and a (4-2)th width d2, which are smaller than the (3-1)th width c1 and the (3-2)th width c2.

In this way, the openings corresponding to unit pixel electrodes placed in an upper portion are made smaller in size than the openings corresponding to unit pixel electrodes placed in a lower portion.

Moreover, the openings BO11 to BO63 of the black matrix BM adjacent to the non-pixel area NPA may be reduced in size proportionally.

In this way, stepped lines on the black matrix BM can be made less visible since the openings of the black matrix BM are made in different sizes and scaled in size proportionately if they are located adjacent to the non-pixel area NPA.

While the foregoing exemplary embodiment has been described with respect to adjusting the size of the openings of the black matrix only vertically as in the figures, the size of the openings also may be adjusted horizontally as in the figures. In this way, a step-like pattern formed horizontally, vertically, or diagonally can be made less visible.

Figure 6:
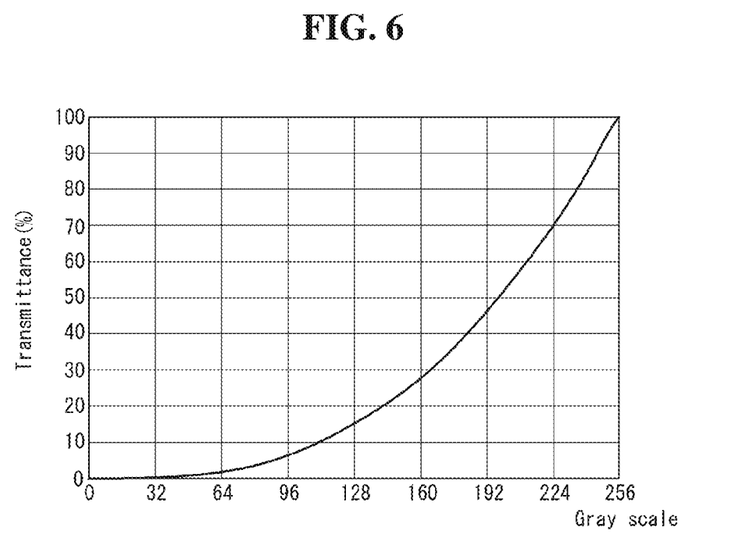
FIG. 6 is a graph illustrating a gamma characteristic curve of a free-form display according to an exemplary embodiment of the present invention.

FIG. 6 is a graph showing a gamma characteristic curve of the free-form display according to the exemplary embodiment of the present invention.

As illustrated in FIG. 6, transmittance is not always linearly proportional to grayscale, so this non-linearity is beneficially taken into account. In the free-form display according to the exemplary embodiment of the present invention, the aperture ratio (i.e., size) of the openings of the black matrix in the free-form portion may be adjusted, taking this linearity into account.

Next, an example of setting the aperture ratio of the openings of the black matrix by taking linearity and non-linearity into account will be described with reference to FIGS. 7A and 7B.

Figure 7A:
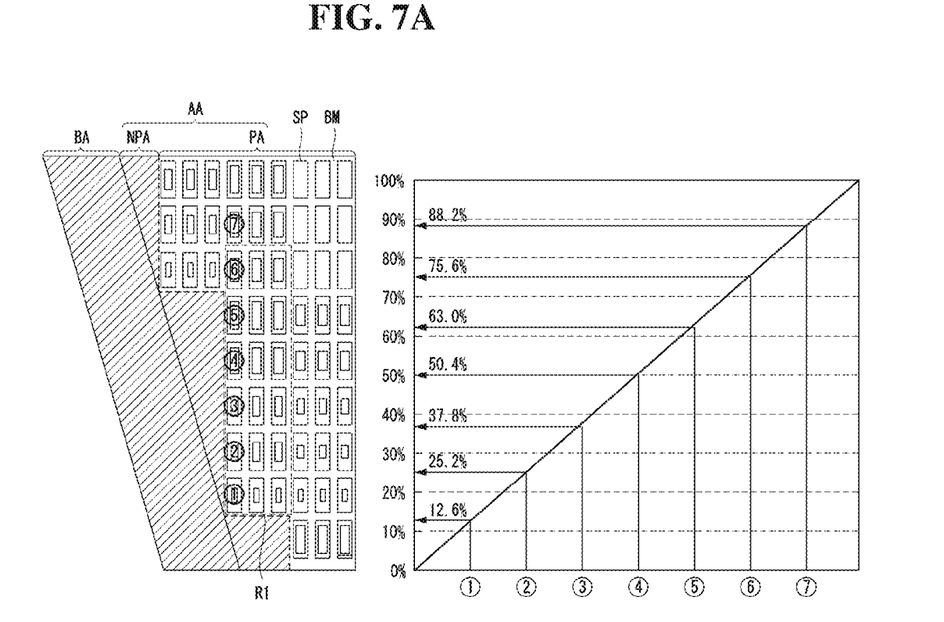
FIG. 7A is a view illustrating a design of a black matrix when the aperture ratio changes linearly with respect to the distance between a pixel area and a non-pixel area.
Figure 7B:
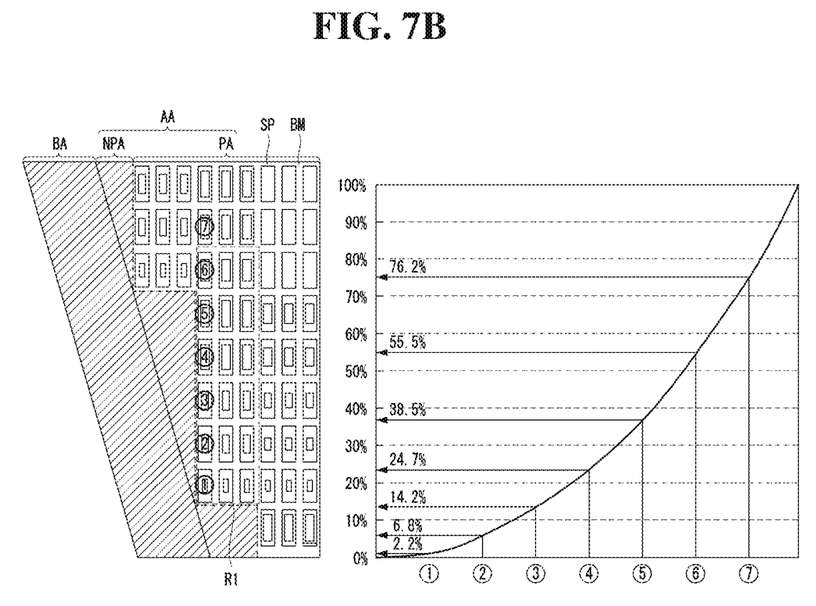
FIG. 7B is a view illustrating a design of a black matrix when a gamma characteristic curve is applied.

FIG. 7A is a view illustrating the design of the aperture ratio of the black matrix when the aperture ratio changes linearly with respect to the distance between the pixel area and the non-pixel area. FIG. 7B is a view illustrating the design of the aperture ratio of the black matrix when a gamma characteristic curve is applied.

Referring to FIG. 7A, the size of the openings of the black matrix BM placed in the pixel area PA changes linearly if they are located adjacent to the non-pixel area NPA. That is, the longer the distance from the boundary between the non-pixel area NPA and the bezel area BA to the openings of the black matrix BM located on the same vertical line in the pixel area PA, the higher the aperture ratio of the openings of the black matrix BM. For example, the aperture ratio may be 12.6% when the openings are at position ∟, 25.2% when the openings are at position ∟, 37.6% when the openings are at position |, 50.0% when the openings are at position ∟, 62.8% when the openings are at position ∟, 75.6% when the openings are at position |, 88.2% when the openings are at position ∟, and 100% at the next position Referring to FIG. 7B, the size of the openings of the black matrix BM placed in the pixel area PA changes non-linearly along a gamma characteristic curve if they are located adjacent to the non-pixel area NPA. That is, the aperture ratio of the openings of the black matrix BM changes non-linearly along a gamma characteristic curve. For example, the aperture ratio may be 2.2% when the openings are at position ∟, 6.8% when the openings are at position ∟, 14.2% when the openings are at position ∟, 24.7% when the openings are at position ∟, 38.5% when the openings are at position |, 55.5% when the openings are at position |, 76.2% when the openings are at position ∟, and 100% at the next position.

Next, some of the benefits obtained from a free-form display according to an exemplary embodiment of the present invention will be described with reference to FIGS. 8A and 8B.

Figure 8A:
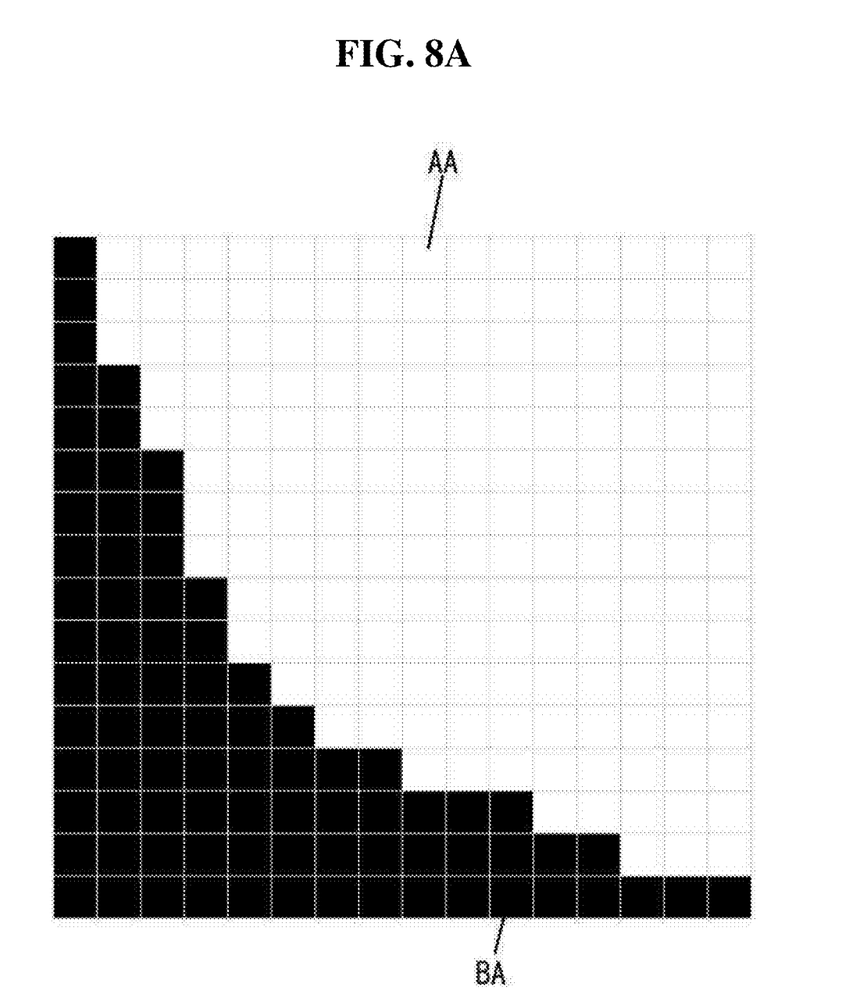
FIG. 8A is a view conceptually illustrating that a boundary line of a black matrix is visible on a related art free-form display.

FIG. 8A is a view conceptually showing that the boundary line of the black matrix is visible on a related art free-form display. FIG. 8B is a view conceptually showing that the boundary line of the black matrix is less visible on a related art free-form display Referring to FIG. 8A, since no pixel electrodes are placed in the non-pixel area NPA of the active area AA, in the case of the related art free-form display, the boundary line between the pixel area PA and the non-pixel area NPA is clearly visible when the display device operates.

Figure 8B:
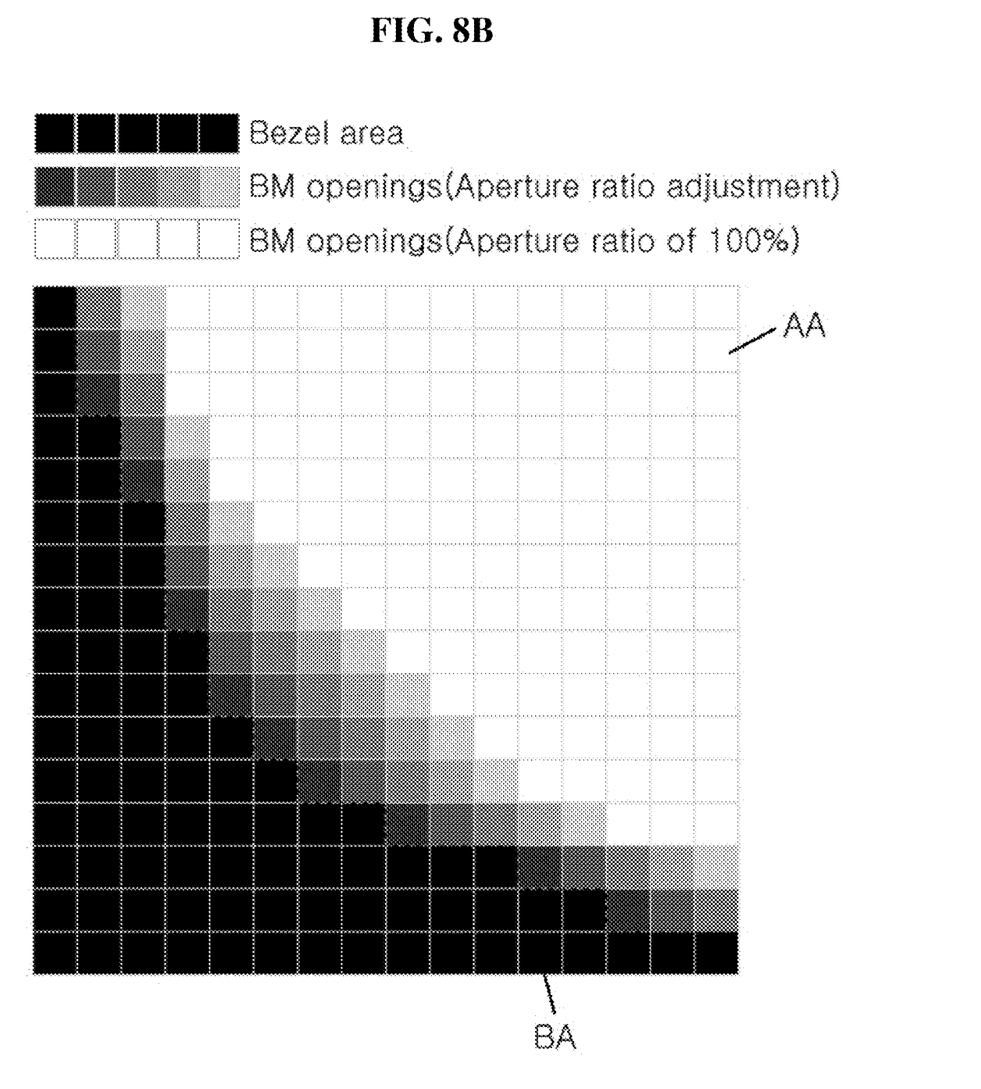
FIG. 8B is a view conceptually illustrating that a boundary line of a black matrix is less visible on a free-form display according to an exemplary embodiment of the present invention.

Referring to FIG. 8B, it can be seen that the boundary line of the black matrix becomes less clearly visible by horizontally or vertically scaling up or down the openings of the black matrix corresponding to the pixel area that are located adjacent to the non-pixel area NPA of the active area AA.

A free-form display according to an exemplary embodiment of the present invention may be adapted for a variety of flat panel displays, including liquid crystal displays (LCDs), plasma display panels (PDPs), organic light-emitting displays (OLEDs), field-emission display devices (FEDs), electrophoretic displays (EDs), etc., which use a black matrix or have an opening adjustment part for adjusting the pixel aperture area.

Throughout the description, it should be understood by those skilled in the art that various changes and modifications are possible without departing from the technical principles of the present invention. Therefore, the technical scope of the present invention is not limited to the detailed descriptions in this specification but should be defined by the scope of the appended claims.

What is claimed is:

1. A free-form display having an active area and a bezel area, at least part of a boundary between the active area and the bezel area having a free-form portion, the free-form display comprising:

a plurality of subpixel electrodes in areas defined by a plurality of gate lines and a plurality of data lines that cross with each other; and a light blocking portion that has openings exposing the plurality of subpixel electrodes and that is arranged to overlap the plurality of gate lines and the plurality of data lines, wherein the active area comprises a subpixel area where the subpixel electrodes are disposed, and a non-pixel area where no subpixel electrodes is disposed, and wherein the openings of the light blocking portion adjacent to the non-pixel area are made in different sizes.

2. The free-form display of claim 1, wherein the openings of the light blocking portion adjacent to the non-pixel area become smaller in size as a shortest distance between an outermost side of the non-pixel area and an outermost side of the subpixel area decreases.

3. The free-form display of claim 2, wherein the openings of the light blocking portion adjacent to the non-pixel area change in size proportionately.

4. The free-form display of claim 2, wherein the openings of the light blocking portion adjacent to the non-pixel area change in size proportionately according to gamma characteristics.

5. The free-form display of claim 2, wherein each of a plurality of unit pixels includes a predetermined number of subpixel electrodes for producing a full-color, and wherein the openings have a same size for each unit pixel.

6. The free-form display of claim 1, wherein the free-form portion has at least one of circular, elliptical, curved, and diagonal shapes.

* * * * *